United States Patent
Soerensen et al.

(10) Patent No.: US 9,810,714 B2
(45) Date of Patent: Nov. 7, 2017

(54) PROBE PIN AND METHOD FOR PRODUCING A PROBE PIN

(71) Applicant: Heraeus Deutschland GmbH & Co. KG, Hanau (DE)

(72) Inventors: Per Soerensen, Langenselbold (DE); Nicole Staudt, Friedberg (DE); Reinhold Weiland, Hanau (DE); Ingo Prunzel, Bruchköbel (DE); David Francis Lupton, Gelnhausen (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 15/034,918

(22) PCT Filed: Nov. 7, 2013

(86) PCT No.: PCT/EP2013/073267
§ 371 (c)(1),
(2) Date: May 6, 2016

(87) PCT Pub. No.: WO2015/067312
PCT Pub. Date: May 14, 2015

(65) Prior Publication Data
US 2016/0252547 A1    Sep. 1, 2016

(51) Int. Cl.
*G01R 1/067* (2006.01)
*G01R 3/00* (2006.01)
*H01R 43/20* (2006.01)

(52) U.S. Cl.
CPC ..... *G01R 1/06755* (2013.01); *G01R 1/06788* (2013.01); *G01R 3/00* (2013.01); *H01R 43/20* (2013.01)

(58) Field of Classification Search
CPC .. G01R 1/06755; G01R 1/06788; G01R 3/00; G01R 1/07314; G01R 1/06711;
(Continued)

(56) References Cited

U.S. PATENT DOCUMENTS 9,625,492 B2 *  4/2017  Hirano ............... G01R 1/06761
2002/0113612 A1  8/2002  Nguyen
(Continued)

OTHER PUBLICATIONS

International Search Report (and English translation) and Written Opinion dated Jul. 23, 2014 in International Application No. PCT/EP2013/073267.
(Continued)

*Primary Examiner* — Thang Le
(74) *Attorney, Agent, or Firm* — Panitch Schwarze Belisario & Nadel LLP

(57) ABSTRACT

A probe pin (100, 100') for electronic testing of semi-conductor elements is provided. The pin contains an electrically conductive core element (200) made up of a metallic alloy, and an electrically insulating jacket element (300) which surrounds the core element (200) over regions thereof. The core element (200) contains a distal contact section (210) for electrical contacting to a semi-conductor element. The metallic alloy of the core element contains at least 67% by weight rhodium, 0.1% by weight to 1% by weight zirconium, up to 1% by weight yttrium, and up to 1% by weight cerium. A method for producing a probe pin is also described.

15 Claims, 6 Drawing Sheets

(58) Field of Classification Search
CPC ............ G01R 1/07342; G01R 1/07307; G01R
1/07357; G01R 1/06722; G01R 1/06716;
G01R 1/07378; G01R 1/0466; G01R
31/2889; G01R 31/3627; G01R 31/3682;
G01R 31/3696; G01R 3/2831; H01R
43/20
USPC ............ 324/755.01–755.07, 755.11, 756.04,
324/754.03, 437, 446, 724, 149
See application file for complete search history.

(56) References Cited

U.S. PATENT DOCUMENTS

| | | | |
|---|---|---|---|
| 2003/0102877 A1* | 6/2003 | Souza | G01R 1/06711 324/755.01 |
| 2006/0197542 A1 | 9/2006 | Tanaka | |
| 2008/0061808 A1* | 3/2008 | Mok | C23C 26/00 324/754.14 |
| 2010/0239453 A1 | 9/2010 | Obata | |
| 2010/0323551 A1* | 12/2010 | Eldridge | G01R 1/06711 439/387 |
| 2012/0237788 A1* | 9/2012 | Fujii | B23K 20/1255 428/615 |
| 2013/0049784 A1* | 2/2013 | Hirano | G01R 1/06761 324/755.01 |
| 2013/0271173 A1* | 10/2013 | Obata | C22C 5/00 324/755.11 |

OTHER PUBLICATIONS

Massalski et al., "Binary Alloy Phase Diagram, Zr—Rh Phase Diagram," ASM International, p. 3249 (Dec. 30, 1990).

* cited by examiner

PROBE PIN AND METHOD FOR PRODUCING A PROBE PIN

CROSS-REFERENCE TO RELATED APPLICATIONS

This application is a Section 371 of International Application No. PCT/EP2013/073267, filed Nov. 7, 2013, which was published in the German language on May 14, 2015 under International Publication No. WO 2015/067312 A1, and the disclosure of which is incorporated herein by reference.

BACKGROUND OF THE INVENTION

The invention relates to a probe pin for electronic testing of semi-conductor elements, comprising an electrically conductive core element, whereby the core element is made up of a metallic alloy, and an electrically insulating jacket element, whereby the jacket element surrounds the core element over regions thereof and the core element comprises a distal contact section for electrical contacting to the semi-conductor element. Moreover, the invention relates to a method for producing a probe pin.

During chip production, semi-conductor elements are contacted with probe pins right after processing in order to test the functioning of the integrated circuits (IC) in un-sawn condition of the semi-conductor elements. The probe pins are fixed in a probe card that is matched to the design of the semi-conductor element. During the testing process, the semi-conductor element is pressed onto the pins and a contacting of the needles and the pads of ICs, possibly through a passivation layer, is established. Then, various parameters are tested, such as the contacting, the pass behavior at high current density, and the electrical behavior upon changes of temperature.

The probe pins must comprise high electrical conductivity and thermal conductivity, have good corrosion resistance, and also have high hardness as well as good elastic properties. With many materials, an increase in the hardness is often associated with an increase in brittleness, which is disadvantageous for the elastic properties and in terms of the processing properties.

Due to the latest development towards increasing miniaturization of ICs on the semi-conductor elements, ever more densely packed arrangements of probe pins on the probe card need to be implemented. Accordingly, there is a need for the probe pins to be increasingly thinner. In order to meet these requirements, the materials used to manufacture the probe pins need to comprise high hardness and good elastic properties and it must be possible to process them into thin wires.

Tungsten-based probe pins are known for testing on aluminum pads. Tungsten and tungsten alloys and tungsten ceramics are very hard, and are therefore well-suited for contacting of aluminum pads, since the oxide or passivation layer, which is omnipresent with aluminum pads, needs to be punctured first. Tungsten is sensitive to oxidation, though. The tungsten oxides thus formed adhere to the aluminum pads and thus lead to undesired contamination at the sites of contacting.

Tungsten is less well-suited for testing on gold pads since gold pads are not as robust as aluminum pads and often do not withstand testing with tungsten-containing probe pins for mechanical reasons.

For use on gold pads, Pd alloys are known, such as, for example, Paliney® H3C made by Deringer Ney or New-Tec® made by Advanced Probing. Palladium is disadvantageous in that extensive reforming processes and precipitation hardening processes are required for the manufacture of suitable palladium alloys. This increases the number of requisite production steps. Moreover, the electrical conductivity of palladium just barely meets the requirements.

US 2006/0197542 A1 and US 2010/0239453 A1 disclose alloys based on iridium for use as probe pins. Iridium has a lower thermal and electrical conductivity than other platinum group metals, and is brittle and inelastic and thus difficult to process.

BRIEF SUMMARY OF THE INVENTION

It is therefore the object of the present invention to overcome the disadvantages of the prior art. Specifically, it is the object of the invention to devise a material which, unlike many palladium-based and/or platinum-based alloys, is hard enough to withstand the million-fold testing on ICs and possesses better thermal and electrical conductivity than palladium and platinum or corresponding alloys. In this context, the material, unlike tungsten, which has the requisite hardness, should be oxidation-resistant. Moreover, it should be easy to process the material into thin probe pins to meet the requirement of high packing density on probe cards.

To meet this object, a probe pin for electronic testing of semi-conductor elements is provided. The probe pin comprises an electrically conductive core element comprising a metallic alloy, and an electrically insulating jacket element, wherein the jacket element surrounds the core element over regions thereof, and wherein the core element comprises a distal contact section for electrical contact with a semi-conductor element. The metallic alloy of the core element comprises at least 67% by weight rhodium; 0.1% by weight to 1% by weight zirconium; up to 1% by weight yttrium; and up to 1% by weight cerium.

A method for producing the probe pin comprising the steps of:

a. providing a cylinder-like pre-mold comprising the metallic alloy forming the core element, wherein the metallic alloy comprises at least 67% by weight rhodium; 0.1% by weight to 1% by weight zirconium; up to 1% by weight yttrium; and up to 1% by weight cerium;

b. drawing the pre-mold into a wire;

c. subdividing the wire into wire-sections to provide the electrically conductive core element of the probe pin;

d. applying the electrically insulating jacket element onto the core element; and e. providing a cone-like distal contact section of the core element.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
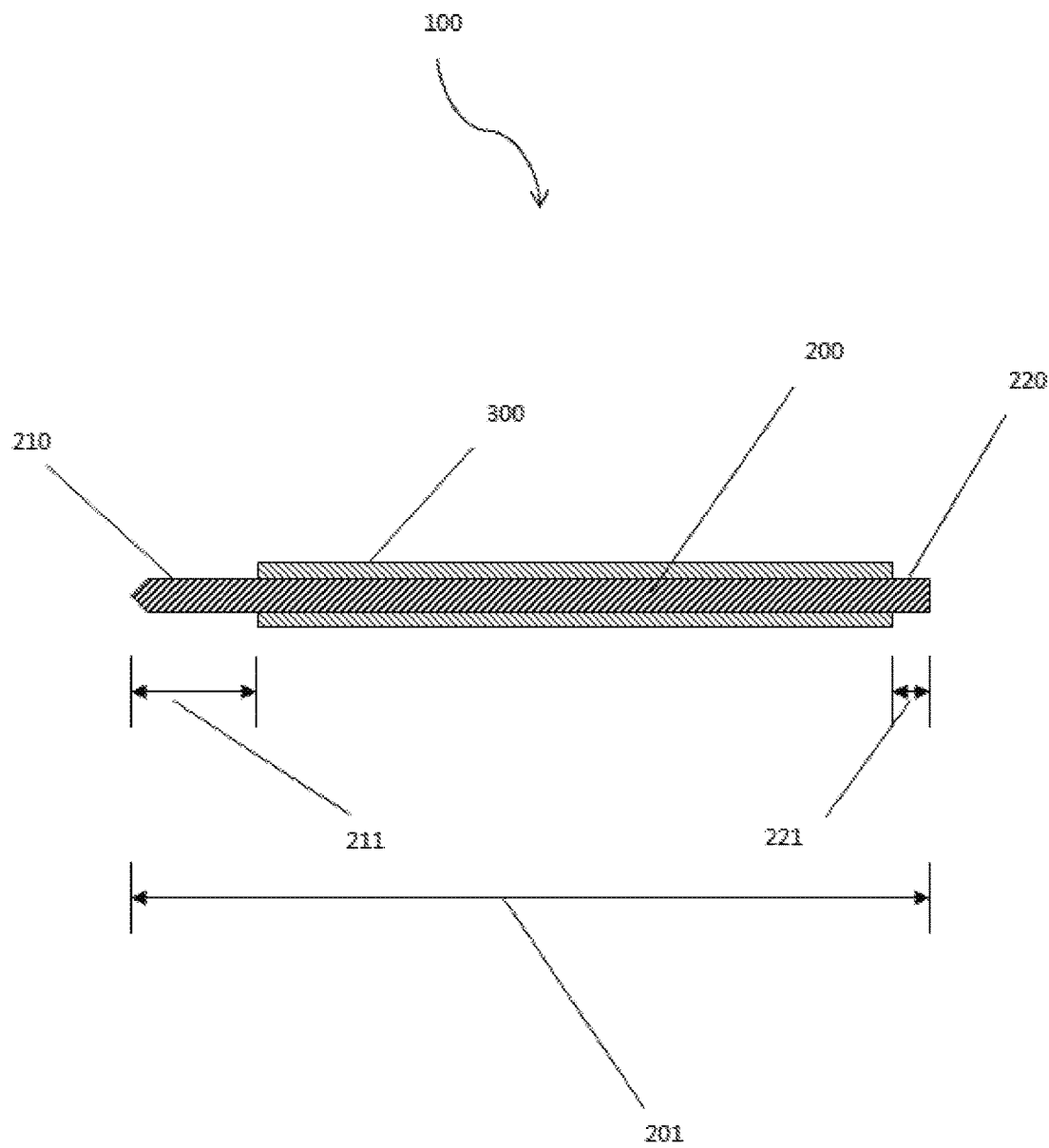
FIG. 1 shows a longitudinal section of a probe pin according to an embodiment of the invention comprising an electrically conductive core element and an electrically insulating jacket element.

The probe pin according to the invention is characterized in that the metallic alloy of the core element comprises:
at least 67% by weight rhodium;
0.1% by weight to 1% by weight zirconium;
up to 1% by weight yttrium; and
up to 1% by weight cerium.

Iridium and other platinum group metals are disadvantageous as compared to rhodium in that their electrical conductivities and thermal conductivities are lower. High electrical conductivity and thermal conductivity are desirable properties for the use in probe pins, and these are met by rhodium.

Pure rhodium has a high modulus of elasticity and shows overly plastic behavior when used in probe pins. For this reason, it was proposed to alloy rhodium and iridium. However, at rhodium fractions of more than 30% by weight, the processing of the material into thin wires becomes difficult and frequent wire breakage must be expected.

Surprisingly, it has been found that rhodium containing zirconium fractions of 0.1% by weight to 1% by weight can still be processed according to the invention to produce thin wires, while the existing advantages over iridium in terms of the thermal and electrical conductivity and the much lower modulus of elasticity, i.e., better elastic properties, are retained.

It has been found that rhodium-based metallic alloys containing a rhodium fraction of at least 67% by weight rhodium and a zirconium fraction of 0.1% by weight to 1% by weight zirconium can be easily processed into thin wires. This means that metallic alloys for use as core elements for probe needles (pins) are made accessible, which provide the advantages of pure rhodium in terms of hardness, thermal conductivity, and electrical conductivity and low modulus of elasticity usable in probe pins for electronic testing of semi-conductor elements.

Adding zirconium to rhodium in an alloy is associated with grain refinement of the metal micro-structure, which impedes grain growth at temperatures above 150° C. and thus surprisingly attains good deformability of the metallic alloy at diameters of up to 50 µm to 100 µm. Moreover, adding zirconium and, optionally, yttrium and cerium to the alloy generates a metallic alloy, which unlike pure rhodium, can be hardened for manufacture of the core element of the probe pin. After deformation to the target diameter, the material can be hardened through a simple temperature treatment, which can be implemented inexpensively.

In this context, the hardness of the rhodium-based metallic alloy according to the invention can be adjusted appropriately such that little or no damage to the gold pads can be ensured. Probe pins according to the invention for the contacting of gold pads possess a hardness of 400 HV to 650 HV. The hardness of the metallic alloy can just as well be adjusted to be high for use in probe pins for aluminum pads. Probe pins according to the invention for the contacting of aluminum pads possess a hardness of 500 HV to 750 HV. Moreover, easy processing is feasible to allow wires to be produced with diameters of 50 µm to 150 µm, for example of 80 µm, in a standard process without having to expect wire breakage. Moreover, the probe pins can be manufactured to possess a high degree of linearity in order to enable accurate contacting of the contacts (gold pads or aluminum pads). Moreover, probe pins according to the invention comprise sufficient elastic properties such that the probe pins show no plastic deformation during the contacting process and thus the contact between the probe pin and the contact pad is stabilized and wear and tear of the probe pin is minimized.

Not least, the metallic alloys for the core element described presently are advantageous in that they can be etched. Thin rhodium layers being amenable to etching are advantageous for shaping the tip during the manufacture of the probe pins. Etching media for the texturing of thin rhodium layers are known to a person skilled in the art.

In the scope of the invention, the term "core element" shall refer to the inner part of a probe pin as seen in a cross-section, whereby the core element is electrically conductive and elongated in shape. The core element is made up of the metallic alloy, in particular the core element comprises at least 67% by weight rhodium, 0.1 to 1% by weight zirconium, up to 1% by weight yttrium, and up to 1% by weight cerium.

In the scope of the invention, the term "semi-conductor element" shall refer to a system of integrated circuits, built up layer by layer, on a substrate body. The term also includes a current-conducting means that is applied onto the multi-layer system of integrated circuits and is intended to connect to conduction elements, such as, e.g., bond wires, ribbons. Accordingly, this specifically includes a contact pad or a wafer.

The term "jacket element" refers to an element, which, seen in cross-section, surrounds the core element at least partly, whereby the jacket element is electrically insulating.

The "distal contact section" is the terminal region of the core element by which the contacting of probe pin and contact pad on the semi-conductor element is established during the electronic testing of the semi-conductor element. In one embodiment, the distal contact section comprises a tip that serves for the actual contacting of the distal contact section on the contact pad.

The "grain size" is the diameter of the grains of the metal micro-structure, whereby the diameter is measured transverse to the longitudinal axis of the core element.

"Grain refinement" refers to a property of metals and metallic alloys, i.e., that the addition of a certain element or certain elements to a metal or a metal alloy is observed to be associated with a change of the grain sizes of the micro-structure of the metal or metal alloy towards smaller grain sizes.

"Hard-drawn condition" refers to the condition of the metallic alloy after forming, for example after drawing an ingot into a wire. During cold forming of metals or metal alloys, the crystal lattices of the metals or metallic alloys become distorted, which increases the strength of the metal or metal alloy, but decreases the deformability.

"Heat-treated condition" refers to the condition of the metallic alloy after a temperature treatment. As a result of the temperature treatment of a cold-formed alloy, an at least partly new metal micro-structure arises, which restores the original properties of the alloy from before cold-forming, at least in part.

"Temperature treatment" refers to treatment of the metallic alloy at elevated temperature, whereby "elevated temperature" refers to a temperature of at least 150° C.

"Cross-talk" is the well-known phenomenon in electrical engineering of mutual interference of parallel lines. Cross-talk leads to mutual interference between different lines. Cross-talk leads to interference of signals in probe pins arranged right next to each other.

A preferred embodiment of the probe pin is characterized in that the metallic alloy of the core element comprises at least 97% by weight rhodium. If the rhodium fraction of the core element of the probe pin is high, the good basic properties of pure rhodium in terms of high thermal conductivity, high electrical conductivity, high elasticity, and high hardness prevail. In combination with a zirconium fraction of 0.1% by weight to 1% by weight, this allows wires that are thin and can be hardened to be produced for manufacture of probe pins according to the invention.

A further preferred embodiment of the probe pin provides the metallic alloy of the core element to comprise any of the following compositions:

The metallic alloy consists of 0.1 to 1% by weight zirconium with the remainder being rhodium.

The metallic alloy consists of 0.1 to 1% by weight zirconium, 0.001% by weight to 1% by weight yttrium with the remainder being rhodium.

The metallic alloy consists of 0.1 to 1% by weight zirconium, 0.001% by weight to 1% by weight cerium with the remainder being rhodium.

The metallic alloy consists of 0.1 to 1% by weight zirconium, 0.001% by weight to 1% by weight cerium and 0.001% by weight to 1% by weight yttrium with the remainder being rhodium.

These compositions of metallic alloys according to the invention have proven to be particularly beneficial in terms of the properties that are important for probe pins as mentioned above.

Another preferred embodiment of the probe pin provides the metallic alloy of the core element to comprise 0.2% by weight to 0.6% by weight zirconium. These compositions provide for good subsequent hardening properties of the metallic alloy forming the core element such that the hardness can be adjusted at a later point in time, which is advantageous for the use in probe pins.

A further embodiment of the invention provides the metallic alloy of the core element to comprise at least one of the two metals: 0.01% by weight to 0.5% by weight yttrium and 0.01% by weight to 0.5% by weight cerium. Adding yttrium and/or cerium to the alloy, preferably at the fractions specified above, provides another way of advantageously controlling the hardness of the metallic alloy and the hardening properties of the metallic alloy through the temperature treatment.

Moreover, the invention can provide the metallic alloy of the core element to comprise 0.01% by weight to 15% by weight platinum and/or 0.01% by weight to 15% by weight iridium. Adding platinum and/or iridium to the alloy allows the mechanical properties of the metallic alloy to be improved. In particular, the elasticity and/or hardness of the core element made from this metallic alloy are thus improved.

Furthermore, the invention can provide the metallic alloy of the core element to be appropriate such that it comprises a grain refinement in order to possess higher extensibility as compared to at least 99.999% pure rhodium. Grain refinement of the metallic alloy as compared to pure rhodium increases the extensibility to the extent that simple and inexpensive processing of the metallic alloy into wires with a diameter of 50 μm to 100 μm is made feasible.

Moreover, the invention can provide the metallic alloy of the core element to comprise an equal-grained metal micro-structure. The advantages of metallic alloys according to the invention in terms of the formability into thin wires are implemented especially advantageously in equal-grained metal micro-structures.

The invention can provide the mean grain size of the metallic alloy of the core element to be between 0.01 μm and 2 μm, preferably between 0.02 μm and 0.5 μm, particularly preferably between 0.05 μm and 0.1 μm. These grain sizes allow for particularly simple processing into thin wires for formation of the core elements of probe pins according to the invention.

A preferred embodiment of the probe pin provides the hardness of the metallic alloy of the core element to range from 300 HV to 800 HV. This hardness range is well-suited for all testing methods for semi-conductor elements known according to the prior art. A preferred embodiment of the probe pin provides the hardness of the metallic alloy of the core element in hard-drawn condition to range from 500 HV to 750 HV and/or the hardness in a heat-treated condition to range from 400 HV to 650 HV for the contacting of semi-conductor elements to gold pads or aluminum pads by means of the distal contact section of the core element. These hardness values are well-suited for the contacting of both gold pads and aluminum pads, whereby the metallic alloy for probe pins forming the core element has a broad range of uses.

Moreover, the invention can provide the distal contact section of the core element to be conically shaped. A probe pin having a conical contact section of the core element formed as a tip is a preferred embodiment since it is easy to manufacture and is preferred in the application on probe cards.

Another embodiment provides the core element to comprise a proximal contact section for electrical contacting to a probe card. The core element of the probe pin needs to comprise a proximal contact section that is not encompassed by the jacket element and can be electrically contacted on a probe card.

Another embodiment of the probe pin provides the core element of the probe pin to have a diameter of 20 μm to 300 μm. The metallic alloy being the core element of the probe pin is well-suited for generating core elements for probe pins that cover a broad range of applications. A preferred embodiment provides the core element of the probe pin to have a diameter of 60 μm to 100 μm for use of the probe pin on probe cards according to the arrangement in the cantilever test. Another preferred embodiment provides the core element of the probe pin to have a diameter of 175 μm to 225 μm for use of the probe pin on probe cards bearing vertically arranged probe pins.

A further preferred embodiment provides the jacket element fully surrounding the core element in circumferential direction and provides the jacket element partly surrounding the core element in longitudinal direction. Probe pins of this geometry can be manufactured easily and inexpensively.

Another advantageous embodiment provides the electrically insulating jacket element to be shaped like a cladding tube, in particular to be cladding tube-like and capable of being pushed onto the core element, in order to form a force-locked connection between core element and jacket element. Separate manufacture of insulating cladding tube-like jacket elements that can be pushed onto the core element of the probe pin provides for easy and inexpensive manufacturing of probe pins.

Alternatively, the invention provides the electrically insulating jacket element as a coating in order to form a firmly-bonded connection between core element and jacket element. Coatings can be implemented to be thin, for example with the thickness of the layer being less than 6 µm, such that coatings meet the requirements of high packing densities of probe pins on probe cards.

The invention can just as well provide an electrically conductive layer-like encompassing element to fully surround the electrically insulating jacket element in circumferential direction and to at least partly surround it in longitudinal direction in order to counteract cross-talk between probe pins arranged next to each other. Cross-talk between probe pins arranged next to each other can be counteracted effectively by providing the probe pins with an electrically conductive layer-like encompassing element. Cross-talk is noted to an increased degree when the packing density of probe pins on probe cards is high. The electrically conductive layer-like encompassing element shields the signal flow in the core element during the testing of the semi-conductor element such that it is influenced less strongly by adjacent interfering signals. The thickness of the layer of the electrically conductive layer-like encompassing element is 1 to 10 µm, preferably 5 µm.

In this context, the invention can provide the electrically conductive layer-like encompassing element to be earthed through an electrically conductive earth connection. Earthing of the electrically conductive layer-like encompassing element serves for rapid potential equalization when interfering currents occur.

Another advantageous embodiment of the probe pin provides an electrically insulating layer-like surrounding element to fully surround the electrically conductive layer-like encompassing element in circumferential direction and to at least partly surround it in longitudinal direction in order to shield the electrically conductive layer-like encompassing element. Shielding the electrically conductive layer-like encompassing element prevents detrimental effects upon mutual contact of the electrically conductive encompassing elements and makes reliable and stable measurements feasible.

In this context, an embodiment of the probe pin according to the invention provides the electrically insulating jacket element and/or the electrically insulating layer-like surrounding element to comprise, or consist of, at least one plastic material selected from the following group: Polyethylene, polypropylene, polycarbonate, polyimide, polyesterimide, polyamideimide, polyurethaneimide, and parylene. These plastic materials are advantageous as compared to other plastic materials in terms of tightness (so-called "pinhole resistance"), dielectric disruptive strength and thermal strength. Accordingly, these plastic materials possess breakdown voltages, at a coating thickness, e.g., of 0.06 mm, of at least 170 V/µm and thermal strength values of at least 180° C. in the heat shock test in accordance with DIN 60851-6:2012.

Another embodiment of the probe pin according to the invention provides the electrically conductive layer-like encompassing element to comprise, or consist of, at least one plastic material selected from the following group: polyethylene, polyphenylene, polypyrrole, polythiophene, polyquinoline, and polypyridine. These polymers are conductive polymers which comprise conjugated double bonds in their main chain and are therefore well-suited to provide an electrically conductive layer-like encompassing element.

The electrically conductive encompassing element and the electrically insulating surrounding element are provided analogous to the electrically insulating jacket element to be shell-like or as a coating.

The object of the present invention specified above is also met through a method for producing a probe pin for electronic testing of semi-conductor elements, whereby the probe pin comprises an electrically conductive core element, the core element is made up of a metallic alloy and the probe pin comprises an electrically insulating jacket element, the jacket element surrounds the core element over regions thereof and the core element comprises a distal contact section for electrical contacting of the probe pin on the semi-conductor element, comprising the steps of:

a. providing a cylinder-like pre-mold made of a metallic alloy forming the core element, whereby the metallic alloy comprises:
   at least 67% by weight rhodium;
   0.1% by weight to 1% by weight zirconium;
   up to 1% by weight yttrium; and
   up to 1% by weight cerium;
b. drawing the pre-mold into a wire;
c. subdividing the wire into wire-sections in order to provide the electrically conductive core element of the probe pin;
d. applying the electrically insulating jacket element onto the core element; and
e. providing a cone-like distal contact section of the core element.

Features and details described in the context of the probe pin shall also apply with respect to the method, and vice versa.

The jacket element can be equally well applied onto the core element after or before sub-dividing the wire into wire sections.

The probe pins according to the invention can be manufactured through numerous feasible combinations of the method according to the invention.

A preferred embodiment of the method according to the invention provides the metallic alloy of the core element to be hardened through a temperature treatment, whereby the hardness is being adjusted by the temperature treatment. The invention is based on the surprising finding that adding zirconium at the specified fractions to rhodium in an alloy allows a metal alloy to be provided that can be hardened and comprises both the requisite elasticity and the requisite hardness for use as a core element for a probe pin. Moreover, the metallic alloy can be processed easily beforehand such that the core element of the probe pin is easy to manufacture. The hardness can be adjusted subsequently by annealing or tempering of the drawn wire and/or of the pre-made probe pin. A hardness that is well-suited for testing the contacts of gold pads or aluminum pads can be adjusted variably.

In this context, the invention can preferably provide the temperature treatment to proceed at a temperature between 150° C. and 600° C. and the temperature treatment to proceed for a period of at least 10 minutes. In this context, the invention preferably provides the temperature treatment to proceed in a range between 200° C. and 400° C.

Moreover, the invention provides the cone-like distal contact section of the core element in step e. to be provided by etching. The metallic alloy according to the invention forming the core element can be etched well such that the distal contact section of the core element can be etched easily and without much effort to form a tip such that no laborious mechanical sharpening of the probe pins is involved.

In the scope of the method according to the invention, the invention can provide, after step d, an electrically conductive layer-like encompassing element to be applied at least in part in longitudinal direction and to be applied fully in circumferential direction in surrounding manner onto the electrically insulating jacket element. The advantage of providing the probe pin with an electrically conductive layer-like encompassing element is that this counteracts the cross-talk between probe pins arranged adjacent to each other during the electrical testing of semi-conductor elements. Cross-talk can be an issue in particular at high packing densities of probe pins on probe cards. The electrically conductive layer-like encompassing element shields the signal flow in the core element during the testing of the semi-conductor element such that it is influenced less strongly by adjacent interfering signals.

Another embodiment of the method according to the invention provides, after application of the electrically conductive layer-like encompassing element, for applying an electrically insulating layer-like surrounding element at least partly in longitudinal direction and fully in circumferential direction in surrounding manner onto the electrically conductive layer-like encompassing element. Applying the electrically insulating layer-like surrounding element onto the electrically conductive layer-like encompassing element provides for additional shielding of the electrically conductive layer-like encompassing element. Shielding the electrically conductive layer-like encompassing element prevents detrimental effects upon mutual contact of the electrically conductive encompassing elements and renders reliable and stable measurements feasible during the electrical testing of semi-conductor elements.

In a further preferred embodiment of the method according to the invention, step d is performed before step c and the jacket element is applied fully onto the core element in longitudinal direction. Applying the electrically insulating jacket element onto the core element before sub-dividing the wire into wire sections allows precursors of probe pins to be manufactured easily and rationally. In this context, the invention can provide step d to be performed before step c and, in addition, the electrically conductive layer-like encompassing element and/or the electrically insulating layer-like surrounding element to be applied onto the core element in longitudinal direction. Moreover, it is conceivable to apply the jacket element onto the core element fully in longitudinal direction and fully in circumferential direction in step d.

It is often advantageous to first apply the jacket element fully and to remove it partly in a subsequent step, whereby the jacket element is removed at least partly from the core element in order to expose the core element in the region of the distal and/or proximal contact section. This applies analogously to the electrically conductive encompassing element and the electrically insulating surrounding element.

Preferably, removal is effected by mechanical removal and/or a solvent. It depends on the selection of the plastic material or plastic materials for the jacket element whether a mechanical method or a solvent is better suited for removal.

Moreover, the invention can provide the jacket element, the electrically conductive encompassing element, or the electrically insulating surrounding element to be applied by means of deposition from liquid phase or gas phase. Whether deposition from liquid phase or gas phase is more well-suited depends on the selection of the plastic materials for the jacket element, the electrically conductive encompassing element, and the electrically insulating surrounding element.

In deposition from liquid phase, the jacket element, the electrically conductive encompassing element, or the electrically insulating surrounding element are advantageously applied through painting in an immersion bath or spray painting.

In deposition from gas phase, the jacket element, the electrically conductive encompassing element, or the electrically insulating surrounding element are advantageously applied through vacuum coating.

Another preferred embodiment of the method according to the invention provides the core element to be masked in the region of the proximal and/or distal contact section by a wax coating in order to facilitate the removal of the jacket element, electrically conductive encompassing element, or electrically insulating surrounding element. Since removal methods for plastic materials on probe pins are often feasible only at high mechanical precision or by means of aggressive chemicals, a wax coating applied prior to the actual coating can facilitate the removal, since the plastic materials selected for the jacket element, the electrically conductive encompassing element, or the electrically insulating surrounding element can thus not form a firmly bonded connection to the metallic alloy of the core element.

FIG. 1 shows a schematic view of a longitudinal section of a probe pin 100 according to the invention comprising an electrically conductive core element 200 and an electrically insulating jacket element 300. The probe pin 100 has a length 201. The probe pin 100 comprises a distal contact section 210. The jacket element 300 does not encompass the core element 200 in the region of the distal contact section 210. The region of the distal contact section 210 free of jacket element has a length 211. The probe pin 100 comprises a proximal contact section 220. The jacket element 300 does not encompass the core element 200 in the region of the proximal contact section 220. The proximal contact section 220 has a length 221. The length 221 is 60 to 100 mm for use of the probe pin in the cantilever test. The length 220 is 5 to 40 mm for use of the probe pin in the test with probe pins in vertical arrangement.

The distal contact section 210 shown in FIG. 1 is conically shaped at the tip. The distal contact section 210 serves for contacting the semi-conductor elements during the semi-conductor test. The proximal contact section 220 serves for contacting on a probe card, whereby a multitude of probe pins 100 are arranged on a probe card.

The core element 200 according to the invention in FIG. 1 comprises a metallic alloy. The metallic alloy comprises at least 67% by weight rhodium, 0.18 to 1% by weight zirconium, up to 1% by weight yttrium, and up to 1% by weight cerium. In a preferred embodiment of the invention, the metallic alloy of the core element 200 comprises at least 97% by weight rhodium. In a further preferred embodiment of the invention, the metallic alloy of the core element 200 comprises 0.2% by weight to 0.6% by weight zirconium.

In a preferred embodiment of the invention, the electrically insulating jacket element 300 is provided to be cladding tube-like to be pushed onto the core element 200 in order to establish a force-locked connection of core element 200 and jacket element 300. The electrically insulating jacket element 300 prevents short-circuiting during the testing of semi-conductor elements, when multiple probe pins 100 are arranged densely adjacent to each other on a probe card and the probe pins touch each other.

In an alternative preferred embodiment of the invention, the electrically insulating jacket element 300 is provided as a coating in order to establish a firmly bonded connection of core element 200 and jacket element 300. The jacket element 300 is provided as a coating by deposition from liquid phase or gas phase. In deposition from liquid phase, it is preferred to apply the jacket element 300 by painting in an immersion bath or spray painting. In deposition from gas phase, it is preferred to apply the jacket element 300 through vacuum coating.

Preferably, the coating is applied to a wire that is sub-divided into wire sections in a later production step to provide the core element 200. After sub-dividing the coated wire into wire sections, the coating is removed from the core element 200 in the region of the distal contact section 210 and in the region of the proximal contact section 220. The jacket element 300 is removed in the region of the distal contact section 210 and in the region of the proximal contact section 220 by mechanical removal and/or a solvent.

In a preferred embodiment of the invention, the removal proceeds by a solvent, preferably an acid, that removes the coating in the region of the distal contact section 210 and in the region of the proximal contact section 220 both effectively and without leaving residues, without chemically attacking the core element 200.

In a further preferred embodiment of the invention, the wire is masked by a wax coating, in the region of the distal contact section 210 to be provided in a subsequent step and in the region of the proximal contact section 220 to be provided in a subsequent step. As a result, the coating providing the electrically insulating jacket element 300 is removed easily in a subsequent production step.

After application of the jacket element 300, either cladding tube-like or in the form of a coating, the distal contact section 210 is shaped to be conical to form a tip by polishing or etching. In a preferred embodiment of the invention, the tip of the probe pin 100 is provided by etching.

Plastic materials that have a high breakthrough voltage and temperature resistance and adhere well on the core element 200 are used to provide the electrically insulating jacket element 300. Polyethylene, polypropylene, polycarbonate, polyimide, polyesterimide, polyamideimide, polyurethaneimide, and parylene are preferred.

Figure 2:
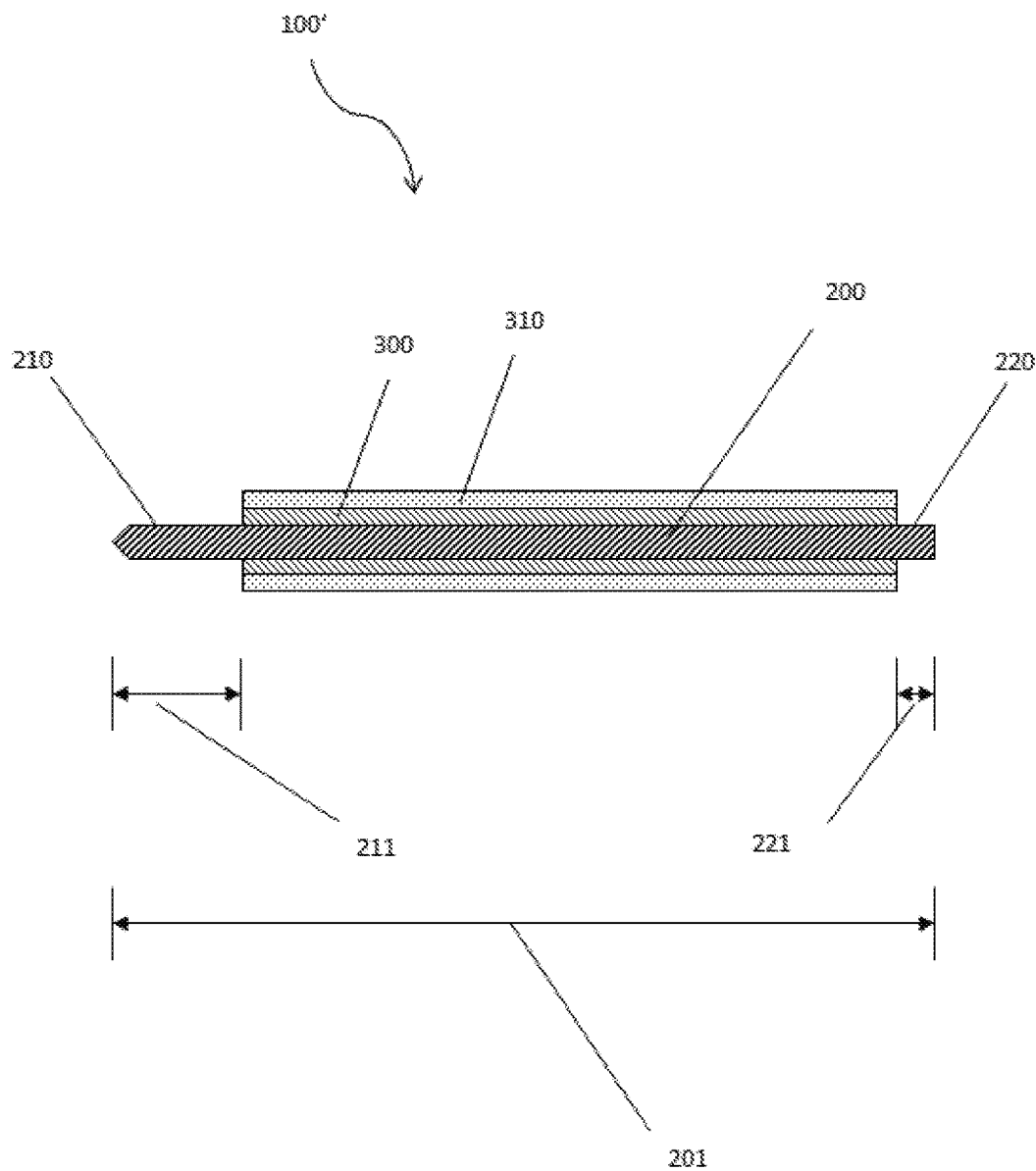
FIG. 2 shows a longitudinal section of a further embodiment of a probe pin according to the invention comprising an electrically conductive layer-like encompassing element.

FIG. 2 shows a schematic view of a longitudinal section of a further embodiment of the probe pin 100 according to the invention comprising an electrically conductive layer-like encompassing element 310. The probe pin 100' has a length 201. The probe pin 100' comprises a distal contact section 210. In the region of the distal contact section 210, the core element 200 is not encompassed by the jacket element 300 and the electrically conductive layer-like encompassing element 310. The region of the distal contact section 210 free of jacket element and free of the electrically conductive layer-like encompassing element 310 has a length 211. The probe pin 100' comprises a proximal contact section 220. In the region of the proximal contact section 220, the core element 200 is not encompassed by the jacket element 300 and the electrically conductive layer-like encompassing element 310. The proximal contact section 220 has a length 221.

The electrically conductive layer-like encompassing element 310 is electrically conductive in order to counteract cross-talk between probe pins arranged adjacent to each other during the testing of semi-conductor elements. Preferably, the electrically conductive layer-like encompassing element 310 is earthed by means of an electrical earth connection (not shown) in order to provide for rapid electrical potential equalization during the testing of semi-conductor elements.

In one embodiment of the probe pin, the electrically conductive layer-like encompassing element 310 is provided to be cladding tube-like and is to be pushed onto the jacket element 300 in order to establish a force-locked connection of jacket element 300 and electrically conductive layer-like encompassing element 310.

In an alternative embodiment of the invention, the electrically conductive layer-like encompassing element 310 is applied onto the jacket element 300 in the form of a coating. The methods for application of the coating are analogous to the methods described for applying the electrically insulating jacket element 300.

For providing the electrically conductive layer-like encompassing element 310, conductive polymers that possess good conductivity and also high temperature resistance and adhere well on the jacket element 300 are used. Polyethylene, polyphenylene, polypyrrole, polythiophene, polyquinoline, and polypyridine are preferred.

A further embodiment of the invention provides the electrically conductive layer-like encompassing element 310 to be encompassed by an electrically insulating surrounding element (not shown). The electrically insulating layer-like surrounding element shields the electrically conductive layer-like encompassing element 310 both electrically and mechanically. Its function is to prevent harmful effects upon mutual contact of the electrically conductive encompassing elements and to enable reliable and stable measurements during the contacting of probe pins on a semi-conductor element.

Figure 3:
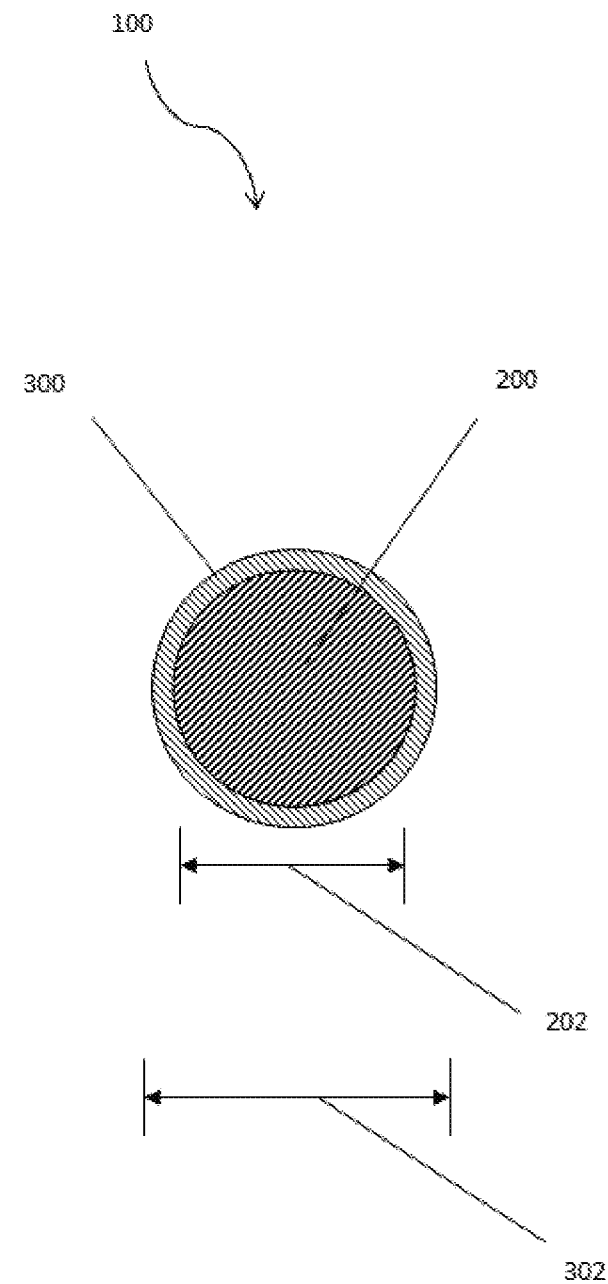
FIG. 3 is a cross-sectional view of the probe pin shown in FIG. 1.

FIG. 3 shows a schematic view of a cross-section of the probe pin 100 shown in FIG. 1. The probe pin 100 comprises the electrically conductive core element 200. The electrically conductive core element 200 has a diameter 202. The electrically insulating jacket element 300 has a diameter 302. In probe pins according to the invention, the diameter 202 of the core element 200 is 20 μm to 300 μm. In a preferred embodiment, the diameter 202 is 60 μm to 100 μm. The probe pins having this core element diameter are well-suited for use in the cantilever test. In an alternative preferred embodiment, the core element diameter 202 is 175 μm to 225 μm. The probe pins having this core element diameter are well-suited for use on probe cards bearing probe pins in a vertical arrangement.

Figure 4:
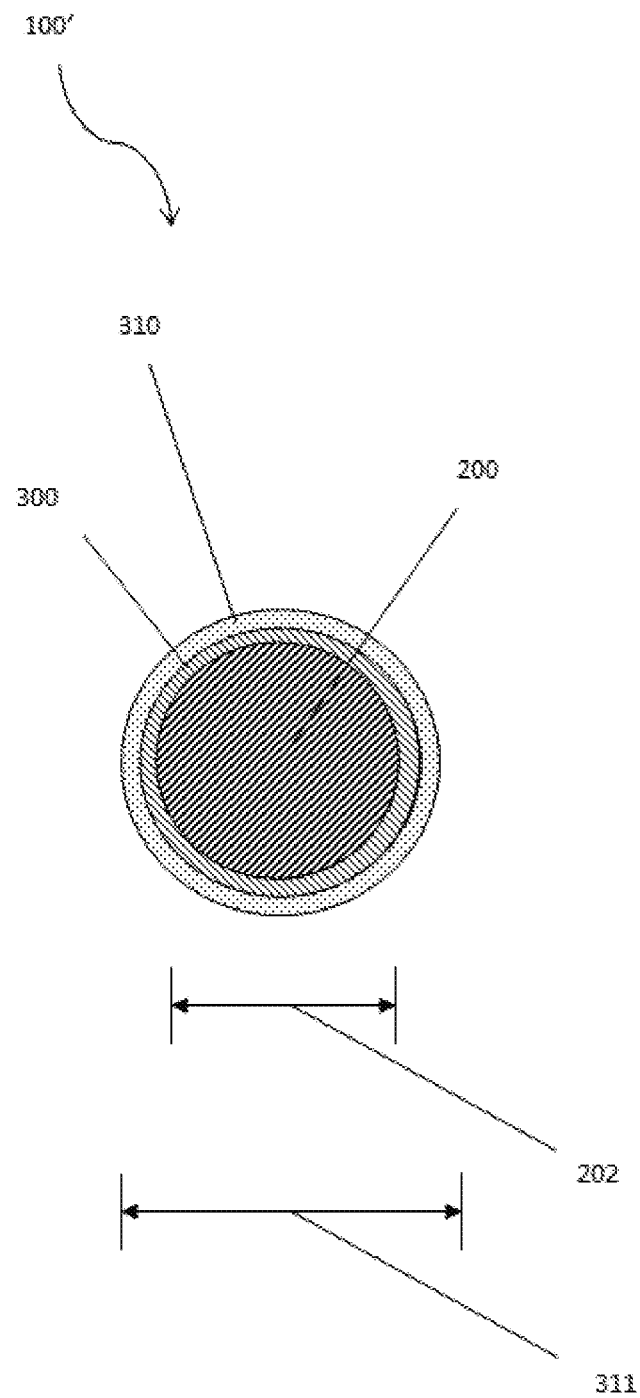
FIG. 4 is a cross-sectional view of the probe pin shown in FIG. 2.

FIG. 4 shows a schematic view of a cross-section of the probe pin 100' shown in FIG. 2. The electrically conductive core element 200 has a diameter 202. The electrically conductive core element 200, comprising the electrically insulating jacket element 300 and the electrically conductive layer-like encompassing element 310, has a diameter 311.

In a probe card (not shown), a multitude of the probe pins 100, 100' shown in FIGS. 1 to 4 are firmly connected by a card body for testing a multitude of electrical connections (contact pads) on the semi-conductor element (not shown) by pressing the probe card onto the semi-conductor element just once. The respective testing methods are known to a person skilled in the art. These shall not be discussed in any detail here.

The probe pins as used must possess high hardness combined with good elastic properties. High hardness is required since probe pins are often used for millions of tests and need to possess sufficient strength for this purpose. In order to stabilize the contact between probe pin and semiconductor element and to minimize the attendant wear on the probe pin, good elastic properties are required.

In experiments on pure rhodium, it was demonstrated that core elements 200 for probe pins having a diameter 202 of the core element 200 of up to 0.08 mm can be produced. But pure rhodium showed overly plastic behavior. The probe pins thus produced showed plastic deformation upon exposure even to low pressures acting on the surface to be tested, i.e., irreversible.

In addition, various low-alloyed rhodium-based metallic alloys were produced and the forging behavior was investigated. All rhodium-based metallic alloys thus tested showed excellent deformation behavior.

The forming behavior in forging and rolling processes (warm/cold) was investigated and the hardening properties of the rhodium-based metallic alloys at temperatures of up to 500° C. were determined.

Figure 6:
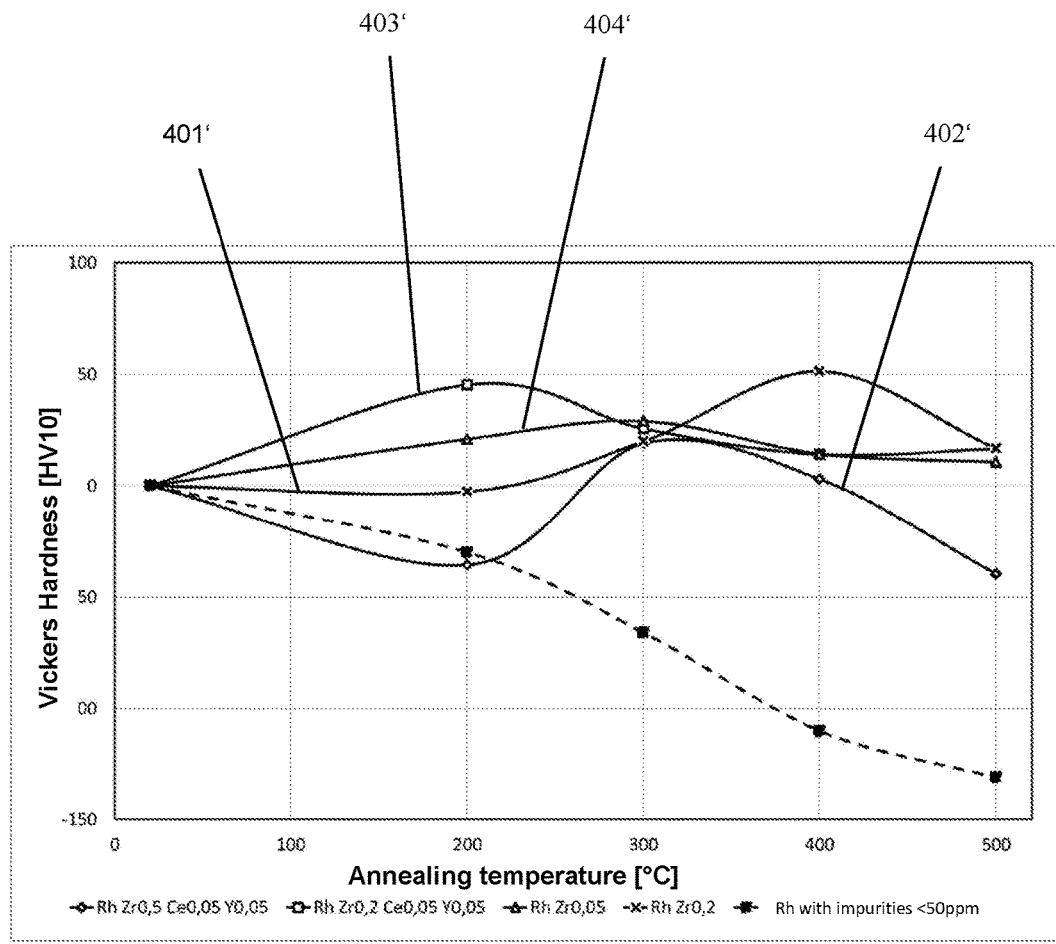
FIG. 6 depicts temperature-hardness curves of selected rhodium-based metallic alloys, (relative change of hardness).

All rhodium-based metallic alloys can be deformed without breakage and, in some cases, can be hardened significantly better, which is a result of the formation of precipitations in the rhodium-based metallic alloys. The increase in hardness was up to 51 HV starting from a hardness of 478 HV at room temperature, as illustrated in FIG. 6. It was thus shown that individual representatives of the rhodium-based metallic alloys discussed presently possess important prerequisites needed to meet the requirements specified above.

Suitable candidate alloys were processed aiming to produce wires for core elements 200 having a diameter 202 (=D) of 0.080 mm. For this purpose, an alloy consisting of a pre-alloy and 99.9% pure rhodium was produced in an arc melt or an ion beam melt or electron beam melt. The ingots were forged hot at 1,200° C. in several cycles. Subsequently, the ingots were grooved roll-treated and wires for core elements 202 were hot-drawn to D=0.3 mm and then cold-drawn to diameter D=0.080 mm with repeated annealing in between.

Mechanical properties were assessed and/or measured by drawing experiments and hardness analyses on sectioned specimens, the processability by the frequency of wire breakage and the dispensed length of wire in one piece in grams, the hardenability by temperature-hardness curves (FIGS. 5 and 6) and the conductivity by a 4-point measurement on a piece of wire 1,000 mm in length.

Table 1 below defines a reference A of pure rhodium and four different rhodium-based metallic alloys B to E and the compositions thereof:

TABLE 1

| | Rh (% by weight) | Zr (% by weight) | Ce (% by weight) | Y (% by weight) |
|---|---|---|---|---|
| Rhodium A | 100 | 0 | 0 | 0 |
| Alloy B | Remainder | 0.5 (5,000 ppm) | 0 | 0 |
| Alloy C | Remainder | 0.2 | 0 | 0 |
| Alloy D | Remainder | 0.5 | 0.05 | 0.05 |
| Alloy E | Remainder | 0.2 | 0.05 | 0.05 |

Figure 5:
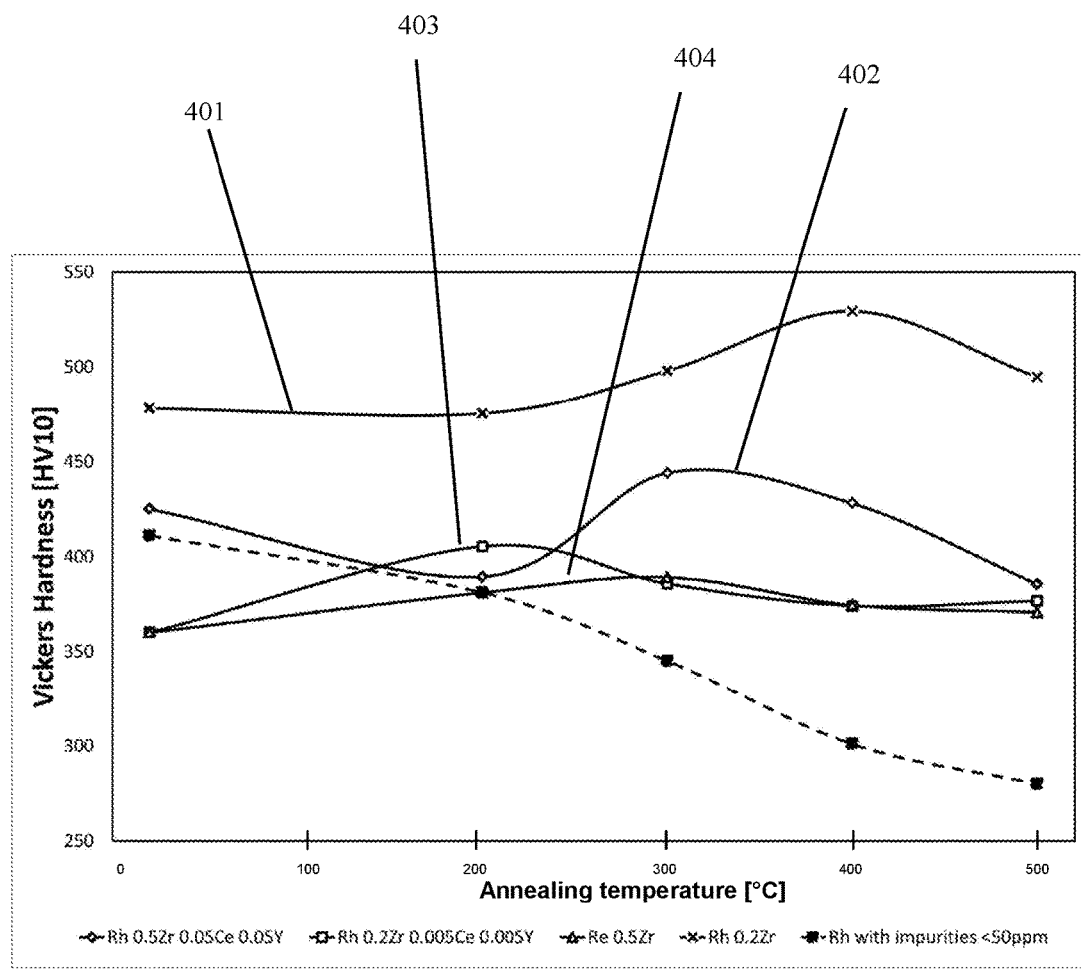
FIG. 5 depicts temperature-hardness curves of selected rhodium-based metallic alloys, (absolute hardness)

FIG. 5 serves as proof of the hardenability of rhodium-based metallic alloys according to the invention. In the experiments, some of these show the highest hardness and strongest hardening due to the formation of precipitations. The specified alloying range includes additional rhodium-based metallic alloys according to the invention. The plot according to FIG. 5 shows the Vickers hardness ([HV10]) over the tempering temperature or annealing temperature (annealing temperature [° C.]) of four preferred rhodium-based metallic alloys. The topmost curve 401 shows the hardness of a rhodium-based metallic alloy containing 0.2% by weight zirconium (alloy C), the second curve from the top 402, showing the second highest hardness for tempering at 400° C., shows the hardness of a rhodium-based metallic alloy containing 0.5% by weight zirconium, 0.05% by weight yttrium, and 0.05% by weight cerium (alloy D), the third curve from the top 403, showing the second highest hardness for tempering at 200° C., shows the hardness of a rhodium-based metallic alloy containing 0.2% by weight zirconium, 0.005% by weight yttrium, and 0.005% by weight cerium (alloy E) and the fourth curve from the top 404, showing the lowest hardness of all rhodium-based metallic alloys for tempering at 200° C., shows the hardness of a rhodium-based metallic alloy containing 0.5% by weight zirconium (alloy B). In addition, FIG. 5 shows the hardness of tempered pure rhodium containing less than 50 ppm of contaminations (dashed line). The superiority of rhodium-based metallic alloys according to the invention upon tempering at temperatures of 200° C. and higher temperatures is clearly evident. The tempering proceeded for an annealing time of 30 minutes in each case.

The measurements evidenced significantly improved mechanical properties in experiments on rhodium-based metallic alloys according to the invention. The experiments were performed in hard-drawn condition.

Table 2 shows the mechanical properties of rhodium and rhodium-based metallic alloys RhZr0.2 and RhZr0.5. The weight of the test stamp for determination of the Vickers hardness was 0.025 g (HV0.025).

TABLE 2

| Material | Tensile N/mm² | Hardness HV0.025 |
|---|---|---|
| Rh (reference) | 1570 | 520 |
| RhZr0.2 | 2200-3300 | 480-690 |
| RhZr0.5 | 2400-3090 | 490-650 |

Moreover, it was found that the addition of zirconium, yttrium, and cerium resulted in clearly improved processability of thin cross-sections of the core element 200 up to 0.050 mm.

Table 3 shows the processability of rhodium-based metallic alloys according to the invention and of rhodium: After identical production, the number of wire breaks per one hundred meters of drawn wire for core element 200 was determined. In addition, the weight of wire for core element 200 produced on average is given, i.e., how heavy the drawn wires would get on average before breaking.

TABLE 3

| Material | Wire breaks per 100 m | Dispensation g |
|---|---|---|
| Alloy A | 18 | <0.5 |
| Alloy B | 1 | >5 |
| Alloy C | 2 | >6 |
| Alloy D | 2 | >7 |
| Alloy E | 3 | >5 |

The hardenability of the rhodium-based metallic alloys presented here is shown in FIG. 6 based on hardness measurements at different annealing temperatures. In this context, FIG. 6 shows the change in Vickers hardness (HV) as a function of the annealing temperature in ° C. It was possible to increase the final hardness by subsequent hardening. Accordingly, reforming at lower strength is feasible which has a positive impact on the reforming result (for example the linearity of the probe pins). Moreover, according to the invention, adjusting the hardness allows the material to be adjusted for use with gold pads or aluminum pads.

Whereas the hardness of pure rhodium decreases upon temperature treatment, the rhodium-based metallic alloys according to the invention can first undergo reforming or production of the probe pins 100, 100' and then the hardness can be adjusted, in particular can be increased, by a subsequent temperature treatment.

It was shown in experiments that zirconium, at the specified concentration ranges, has a positive influence on the processability and hardening of rhodium. Adding zirconium to the alloy (in particular 0.2% by weight Zr and 0.5% by weight Zr) allows rhodium-based metallic alloys according to the invention to be processed into breakage-free wires for core elements 200 having diameters of 0.080 mm. The attainable hardness is in excess of 620 HV. The use as probe pin 100, 100' requires a hardness of 450 to 500 HV and can be adjusted in rhodium-based metallic alloys according to the invention by means of a subsequent aligning-tempering process for optimization of the linearity of the probe pins 100, 100'. Adding yttrium and cerium to the alloy also results in an increase in hardness and improved processability. Neither pure rhodium nor rhodium containing up to 100 ppm of platinum and iridium contaminations due to the processes used, show this effect (see FIGS. 5 and 6). It was not feasible to develop the processing into breakage-free wires for core elements 200 with diameters of 0.080 mm using probe pins 100, 100' made of this pure rhodium into a process suitable for serial production.

Bending experiments on wires for core elements 200 made of RhPt5Zr0.05 and RhIr6Zr0.05 show that these compositions of materials are excellently suited for meeting the special requirements on the elasticity and hardness of probe pins 100, 100'.

Overall, it was determined that the family of alloys according to the invention is a highly conductive rhodium-based metallic alloy which is characterized by its high electrical conductivity as compared to the palladium alloys that are established in the market.

Whereas the electrical conductivity of palladium, platinum, and rhodium is $9.26 \cdot 10^6$ A/(V m), $9.43 \cdot 10^6$ A/(V m), and $23.3 \cdot 10^6$ A/(V m) (40% IACS), respectively, the electrical conductivity of the rhodium alloy containing 0.2% by weight zirconium (alloy C) was measured to be $18.5 \cdot 10^6$ A/(V m) (32% IACS), the electrical conductivity of the rhodium alloy containing 0.5% by weight zirconium, 0.05% by weight yttrium, and 0.05% by weight cerium (alloy D) was measured to be $16.8 \cdot 10^6$ A/(V m) (29% IACS), the electrical conductivity of the rhodium alloy containing 0.2% by weight zirconium, 0.005% by weight yttrium, and 0.005% by weight cerium (alloy E) was measured to be $18 \cdot 10^6$ A/(V m) (31% IACS), and the electrical conductivity of the rhodium alloy containing 0.5% by weight zirconium (alloy B) was measured to be $18 \cdot 10^6$ A/(V m). The conductivity was determined at the following conditions: 4-point measurement with U=10 V and I=10 mA. Calculation of the resistance via measuring the voltage drop. For calculation of the % IACS value, the specific conductivity was related to the specific conductivity of annealed copper (100% IACS=58 MS/m).

Whereas the hardness of rhodium-based metallic alloys according to the invention is clearly improved after a temperature treatment, the electrical conductivity is clearly higher as compared to palladium and platinum. The rhodium-based metallic alloys according to the invention allow a wire for thin core elements 200 to be produced that is better suited for manufacture of a probe pin 100, 100' than palladium and/or platinum, whereas a corresponding wire for core elements 200 made of pure rhodium cannot be manufactured for said purpose. Advantageously, the rhodium-based metallic alloys according to the invention are amenable to subsequent hardening of the material through a temperature treatment after production of the core elements 200 for probe pins 100, 100'.

Adding small amount of yttrium, cerium, and zirconium to rhodium in an alloy leads to a clearly increased recrystallization temperature and improved mechanical properties. Presumably, this is related to precipitations of rhodium-zirconium phases at the grain boundaries.

The conductivity of some pure elements and alloys is given in the following. The conductivity of copper is $59 \cdot 10^6$ A/(V m), rhodium $23.3 \cdot 10^6$ A/(V m), platinum $9.43 \cdot 10^6$ A/(V m), palladium $9.26 \cdot 10^6$ A/(V m), PtNi20, an alloy that is used as a standard especially in Asia, $3.77 \cdot 10^6$ A/(V m), and Pd35Ag30Au10Pt10CuZn $5.8 \cdot 10^6$ A/(V m), whereby the latter alloy is a widely used probe pin material.

As explained above, the electrical conductivity is of central importance for the function of the materials in electrical contacting technology. The rhodium-based metallic alloys according to the invention possess a high conductivity as compared to the known alloys for probe pins. The conductivity is clearly higher than that of common commercial materials PtNi, PdAgCu having an electrical conductivity of less than $7 \cdot 10^6$ A/(V m).

Using rhodium-based metallic alloys each containing less than 0.1% by weight zirconium and 100 ppm to 1.1% % by weight yttrium and cerium and the remainder being rhodium and rhodium-based metallic alloys containing 1.1% by weight zirconium and the remainder being rhodium, it was possible to draw wires for core elements 200, manufactured as described, only with frequent wire breakages, i.e., at least 17 wire breakages per 100 m of wire. Since a serial production process is not conceivable for these alloys due to the frequent wire breakages, the maximal dispensation of wire to wire was not determined.

Based on considerations of the inventors concerning the miscibility and "alloyability" of platinum and iridium with rhodium and the materials properties of these mixtures and alloys, it is concluded that adding platinum and/or iridium to rhodium-based metallic alloys according to the invention has a positive overall influence on the materials properties. Therefore, rhodium-based metallic alloys containing 0.1% by weight to 1% by weight zirconium and 0.1% by weight to 30% by weight platinum and/or 0.01% by weight to 30% by weight iridium are also preferred rhodium-based metallic alloys according to the invention.

The complete miscibility of the elements, rhodium and platinum, from 4% by weight platinum and the complete miscibility of the elements, rhodium and iridium, from 5% by weight iridium is evident from the corresponding binary phase diagrams and is therefore concluded to also apply to the rhodium-based metallic alloys according to the invention.

Adding platinum to the alloy probably reduces the modulus of elasticity and increases the elasticity of rhodium-based metallic alloys according to the invention. This is an advantageous property for contact parts, in particular probe pins, which are exposed to frequently alternating loads.

The features of the invention disclosed in the preceding description and in the claims, figures, and exemplary embodiments, can be essential for the implementation of the various embodiments of the invention both alone and in any combination.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A probe pin for electronic testing of semi-conductor elements, comprising an electrically conductive core element comprising a metallic alloy, and an electrically insulating jacket element, wherein the electrically insulating jacket element surrounds the electrically conductive core element over regions thereof, wherein the electrically conductive core element comprises a distal contact section for electrical contact with a semi-conductor element, and wherein the metallic alloy of the electrically conductive core element comprises at least 67% by weight rhodium; 0.1% by weight to 1% by weight zirconium; up to 1% by weight yttrium; and up to 1% by weight cerium.

2. The probe pin according to claim 1, wherein the metallic alloy comprises at least 97% by weight rhodium.

3. The probe pin according to claim 1, wherein the metallic alloy comprises 0.1% by weight to 0.6% by weight zirconium.

4. The probe pin according to claim 1, wherein the metallic alloy comprises 0.01% by weight to 0.5% by weight yttrium and/or 0.01% by weight to 0.5% by weight cerium.

5. The probe pin according to claim 1, wherein the metallic alloy comprises a grain refinement and a higher extensibility compared to at least 99.999% pure rhodium.

6. The probe pin according to claim 1, wherein the hardness of the metallic alloy in hard-drawn condition ranges from 500 Vickers Pyramid Number (HV) to 750 HV and/or the hardness in a heat-treated condition ranges from 400 HV to 650 HV.

7. The probe pin according to claim 1, wherein the electrically insulating jacket element fully surrounds the electrically conductive core element in a circumferential direction and partly surrounds the electrically conductive core element in a longitudinal direction.

8. The probe pin according to claim 1, further comprising an electrically conductive layer-like encompassing element fully surrounding the electrically insulating jacket element in a circumferential direction and at least partly in a longitudinal direction, and wherein the electrically conductive layer-like encompassing element counteracts cross-talk between probe pins arranged next to each other.

9. The probe pin according to claim 1, wherein the distal contact section is conical in shape.

10. The probe pin according to claim 1, wherein the electrically conductive core element comprises a proximal contact section for electrical contacting with a probe card.

11. A method for producing a probe pin for electronic testing of semi-conductor elements, wherein the probe pin comprises an electrically conductive core element comprising a metallic alloy and an electrically insulating jacket element, wherein the electrically insulating jacket element surrounds the electrically conductive core element over regions thereof and the electrically conductive core element comprises a distal contact section for electrical contacting the probe pin with a semi-conductor element, the method comprising the steps of:
   a. providing a cylinder-like pre-mold comprising the metallic alloy forming the electrically conductive core element, wherein the metallic alloy comprises at least 67% by weight rhodium; 0.1% by weight to 1% by weight zirconium; up to 1% by weight yttrium; and up to 1% by weight cerium;
   b. drawing the pre-mold into a wire;
   c. subdividing the wire into wire-sections to provide the electrically conductive core element of the probe pin;
   d. applying the electrically insulating jacket element onto the electrically conductive core element; and
   e. providing a cone-like distal contact section of the electrically conductive core element.

12. The method according to claim 11, further comprising hardening the metallic alloy through a temperature treatment to adjust the hardness.

13. The method according to claim 12, wherein the temperature treatment is performed at a temperature between 150° C. and 600° C. and for a period of at least 10 minutes.

14. The method according to claim 11, wherein step e. comprises etching to produce the cone-like distal contact section of the core element.

15. A probe pin for electronic testing of semi-conductor elements manufactured according to claim 11.

* * * * *